United States Patent [19]

Takenouchi et al.

[11] Patent Number: 5,561,081
[45] Date of Patent: Oct. 1, 1996

[54] METHOD OF FORMING A SEMICONDUCTOR DEVICE BY ACTIVATING REGIONS WITH A LASER LIGHT

[75] Inventors: Akira Takenouchi; Atsunori Suzuki; Hideto Ohnuma; Hongyong Zhang, all of Kanagawa; Shunpei Yamazaki, Tokyo, all of Japan

[73] Assignee: Semiconductor Energy Laboratory Co., Ltd., Kanagawa-ken, Japan

[21] Appl. No.: 190,846

[22] Filed: Feb. 3, 1994

[30] Foreign Application Priority Data

Feb. 4, 1993 [JP] Japan .................................. 5-040572

[51] Int. Cl.⁶ .............................................. H01L 21/306
[52] U.S. Cl. ........................... 437/174; 437/19; 437/934
[58] Field of Search ................................... 437/174, 247, 437/907, 908, 942; 148/DIG. 3, DIG. 4, DIG. 90, DIG. 91, DIG. 92, DIG. 93

[56] References Cited

U.S. PATENT DOCUMENTS

| | | | |
|---|---|---|---|
| 4,436,557 | 3/1984 | Wood et al. | 437/19 |
| 4,546,009 | 10/1985 | Tiedje et al. | 437/170 |
| 4,646,426 | 3/1987 | Sasaki | 437/174 |
| 5,236,865 | 8/1993 | Sandhu et al. | 437/174 |
| 5,306,651 | 4/1994 | Masumo et al. | 437/173 |

FOREIGN PATENT DOCUMENTS

| | | | |
|---|---|---|---|
| 1-187814 | 7/1989 | Japan | 148/DIG. 3 |
| 2-294027 | 12/1990 | Japan | 437/174 |

OTHER PUBLICATIONS

"Lateral Growth of Poly–Si Films with a Specific Orientation by an Excimer Laser Anneal Method", Jpn. J. Appl. Phys., vol. 32 (1993) Pt. 1 No. 12B.

"Poly–Si By Excimer Laser Annealing with Solidification Process Control", 93/5 vol. J 76–C II No. 5.

"Enlargement of Poly–Sci Film Grain Size by Excimer Laser Annealing and Its Application To High–Performance Poly–Si Thin Film Transistor" Japanese Journal Of Applied Physics, vol. 30, No. 12B, Dec. 1991, pp. 3700–3703.

"Improving the Uniformity of Poly–Si Films Using a New Excimer Laser Annealing Method for Giant Microelectronics", Jpn. J. Appl. Phys., vol. 31 (1992) pp. 4550–4554, Pt. 1, No. 12B, Dec. 1992.

*Primary Examiner*—Chandra Chaudhari
*Attorney, Agent, or Firm*—Sixbey Friedman Leedom & Ferguson; Gerald J. Ferguson, Jr.; Evan R. Smith

[57] ABSTRACT

An improved method of forming a semiconductor device on a glass substrate is described. The method comprises forming a semiconductor film on a glass substrate, heating the semiconductor film by means of a heater to a predetermined temperature, exposing the semiconductor film to pulsed laser light after the semiconductor film has been heated to the predetermined temperature by the heating step. The thermal shock due to sharp temperature change is lessened by the pre-heating step. The width of the pulsed laser light is greater than the height when a cross section is taken perpendicular to a length.

41 Claims, 8 Drawing Sheets

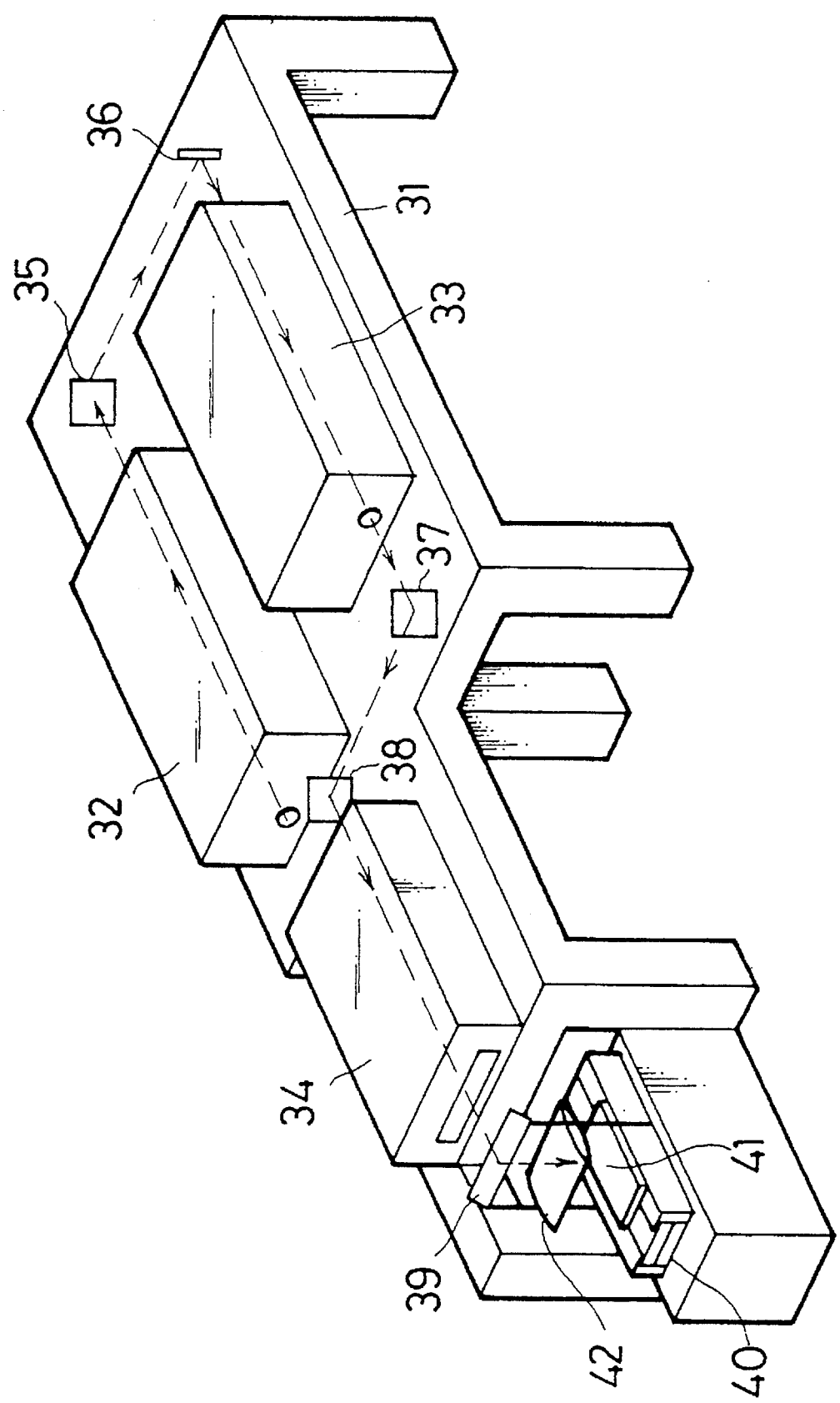

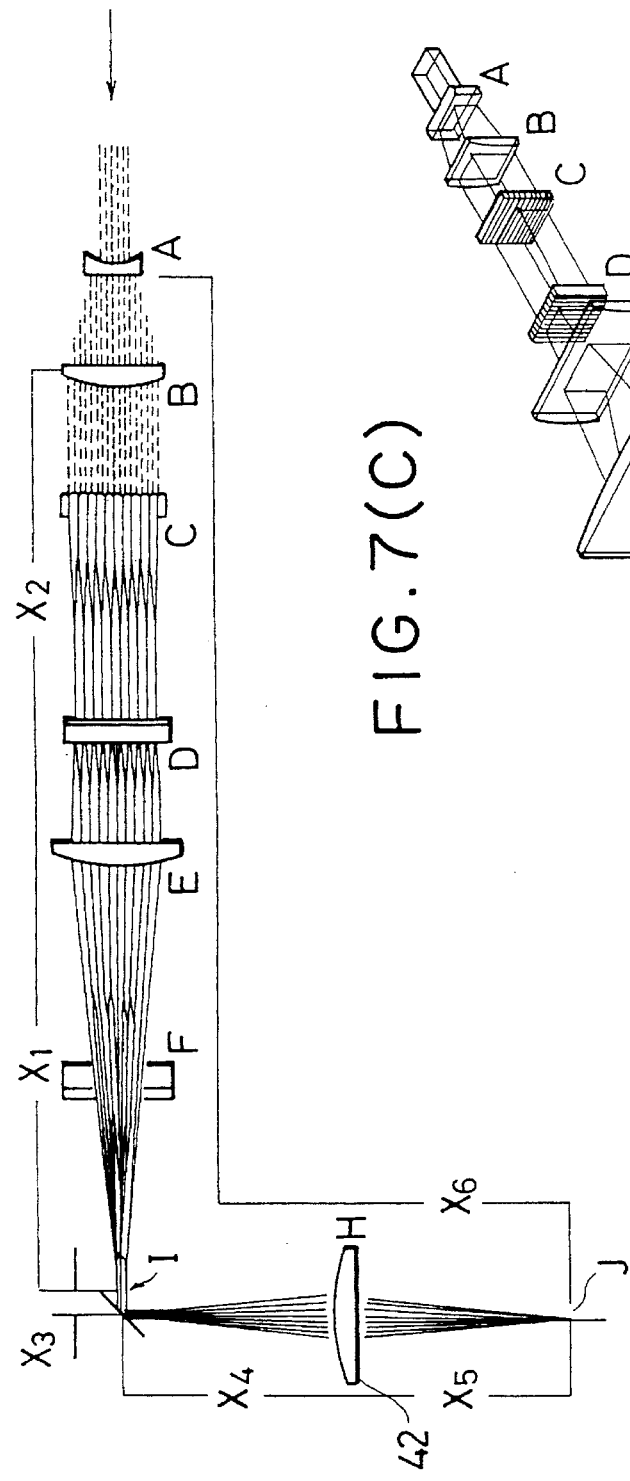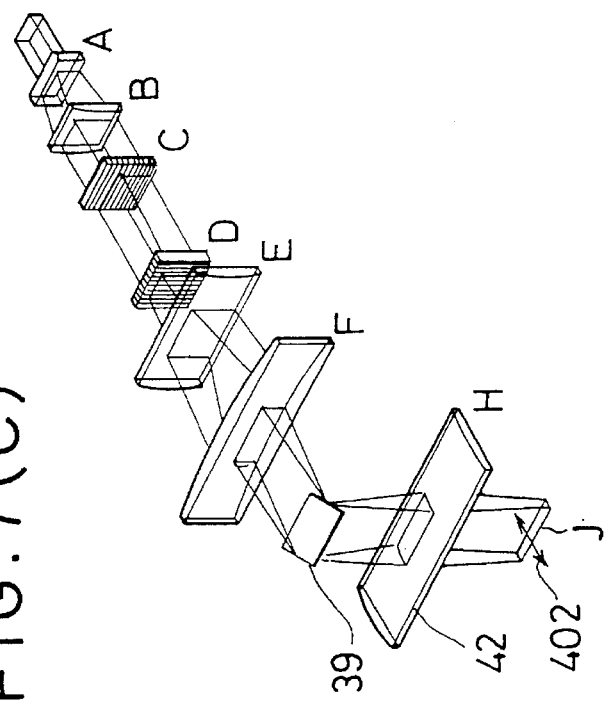

METHOD OF FORMING A SEMICONDUCTOR DEVICE BY ACTIVATING REGIONS WITH A LASER LIGHT

BACKGROUND OF THE INVENTION

1. Field of the Invention

The present invention relates to a method of forming a semiconductor device by activating a semiconductor region with laser light.

2. Description of the Prior Art

Thin film semiconductor devices such as insulated gate thin film field effect transistors (TFTs) have been manufactured by introducing high energy ions into silicon semiconductor films by the ion implantation technique, the plasma doping technique and the like in order to form impurity semiconductor regions. The crystallinity of the semiconductor regions is substantially damaged due to the shock of the ion bombardment during the implantation. The crystallinity of the semiconductor regions must be recovered, e.g., by exposing the semiconductor regions to appropriate light emitted from a laser, a lamp or another suitable light source so that the impurity elements are activated in the semiconductor regions to accord necessary carrier transportation characteristics to them. Because of this, there is a need for a suitable technique by which laser annealing can be utilized for forming the insulated gate thin film field effect transistors since laser anneal is particularly suitable and advantageous for mass-production of semiconductor devices. Particularly, pulsed laser light can be used to effectively heat only the surface portion of the semiconductor region so that improvement of the productivity is expected.

The recrystallization of semiconductor regions by pulsed laser light, however, can not be sufficiently accomplished in accordance with conventional techniques due to a sharp change in temperature during the laser exposure step. Because of this, there tends to remain in the semiconductor region a portion whose crystallinity is inadequate for appropriate carrier transportation so as to lower the reliability of the insulated gate thin film field effect transistors

BRIEF SUMMARY OF THE INVENTION

It is an object of the present invention to improve reliability of a method of forming a semiconductor device by decreasing the dose amount necessary for forming impurity semiconductor regions within a semiconductor film.

It is another object of the present invention to provide a reliable method of performing laser annealing for forming a semiconductor device wherein there is caused few defects in an impurity semiconductor film.

It is a further object of the present invention to provide a reliable method of performing laser annealing for forming a semiconductor device wherein the dose density of an impurity to be introduced into a semiconductor film is substantially decreased and therefore mass-productivity is improved.

It is a still further object of the present invention to provide a reliable method of performing laser annealing for forming a semiconductor device wherein the energy density of laser light necessary to activate an impurity semiconductor region is substantially decreased and therefore mass-productivity is improved.

It is a still further object of the present invention to provide a reliable method of performing laser annealing for forming a thin film semiconductor device such as a field effect transistor wherein an impurity semiconductor region is activated by laser light without causing much stress in the semiconductor region and therefore reliability is improved.

Additional objects, advantages and novel features of the present invention will be set forth in the description which follows, and in part: will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a method of forming a semiconductor device comprising the steps of heating a silicon film containing an impurity and exposing the silicon film to pulsed laser light to activate atoms of the impurity. Preferably, the substrate is heated in order that its temperature reaches a temperature of 100° C. to 500° C. The impurity is either or both phosphorous and boron. The energy density of the pulsed laser light is 200 to 400 mJ/cm$^2$. A higher energy density may damage the silicon semiconductor film.

In accordance with another aspect of the present invention, a method of forming a semiconductor device comprising the steps of forming a gate insulating film over a crystalline silicon film shaped in the form of an island on a substrate, forming a gate electrode on the gate insulating film, introducing phosphorous or boron into the crystalline silicon film through the gate electrode functioning as a mask, and irradiating with pulsed laser light the crystalline silicon having been heated to a temperature of no lower than 100° C., preferably to a temperature between 100° C. and 500° C. An appropriate source of the laser light is an excimer laser which is particularly suitable from the view point of mass-productivity. However, it may be appropriate to select another laser in place of an excimer laser as long as said another laser emits a light having a wavelength of 200 to 400 nm which absorbed by a semiconductor (e.g. silicon). In addition, it is effective for mass-production to scan a linear laser beam on the substrate in a direction perpendicular to the linear laser beam in order to uniformly irradiate the entire substrate with the laser beam.

As described in "Description of the Prior Art", in accordance with the conventional technique in which laser annealing is employed, the temperatures of the semiconductor region is quickly elevated due to absorption of laser light followed by a sharp drop temperature due to heat dissipation. Because of such sharp change in temperature, the doped impurity atoms are immediately frozen before relocation in appropriate position in which the semiconductor regions are given necessary conductivity. As a result, the semiconductor region can not recover from the damage caused by bombardment of impurity atoms into the crystalline structure in which many defect are eventually generated and therefore lower the reliability of the semiconductor device.

Such sharp temperatures change is lessened by preheating the semiconductor regions in advance of the laser annealing. Namely, the temperature of the semiconductor regions only gradually varies during the laser annealing since the temperature is biassed in advance. Particularly, sharp drop temperature can be effectively avoided so that the doped impurity atoms can be moved and relocated in appropriate positions and cause few defects.

On the other hand, it will be understood that necessary characteristics of the semiconductor regions such as the conductivity, the sheet resistance can be obtained only with a smaller amount of impurity atoms doped as compared with the conventional cases. This means that doping time is decreased and therefore the productivity is improved. The damage caused by impurity implantation is also lessened because the amount of impurity itself is decreased so that the productivity is further improved.

Another advantage of the present invention is reduction of the energy density of laser light since the temperature of the semiconductor regions is already elevated to a certain elevated temperature level. This means that a wider area of the semiconductor region can be treated at once since laser light can be expanded to a relatively low energy density and a wide span (width).

A further advantage of the present invention is elimination of the cause of reducing the reliability of thin film transistors manufactured by pulsed laser annealing. An insulated gate thin film field effect transistor is easily formed by the use of self-aligning technique utilizing the gate electrode as a mask when impurity atoms are introduced to form source and drain regions. The impurity regions are given laser annealing. Usually, the impurity region is irradiated from the upper side through the gate electrode to anneal the impurity regions adjacent to the gate electrode. In this case, however, serious stress is often caused at the boundaries between each of the source and drain regions and the channel region since there is substantial difference temperature between the source and drain regions which are heated by exposure to laser light and the channel region which is not exposed to the light because of the presence of the gate electrode. Because of the thermal stress, there are generated many defects in the semiconductor region which lower the reliability of the thin film transistor.

The laser light can be irradiated to the semiconductor layer (e.g. silicon) through the upper surface of the semiconductor layer. In this case, it is preferable to use a laser light having a wavelength of 200 to 400 nm because the semiconductor can absorb the laser light having such a wavelength sufficiently.

If the laser light is projected through the bottom surface of the glass substrate in order to irradiate the semiconductor region only through the transparent glass substrate, the entirety of the semiconductor region is exposed to the laser light so that the above discussed problem (that is, the problem of stress) caused by the temperature difference seems to be solved. However, in practice, other difficulties are raised in this case. If the substrate is made of quartz, laser light emitted from a usual laser such as XeCl excimer laser (wavelength=308 nm) can be passed therethrough. In this case, however, an expensive quartz substrate must be used so that the production cost is substantially elevated. If the substrate is made of a borosilicate glass, e.g. Corning 7059 glass, laser light emitted from a usual laser is substantially absorbed by the substrate and therefore can not reach the semiconductor region. Laser light having a wavelength of no shorter than 400 nm is needed to pass through such a cheaper glass made mainly of a borosilicate glass. However, there have been few practicably available laser which can emit light of 400 to 650 wavelengths. Furthermore, if the wavelength of the laser light is those of infrared light or longer, even the semiconductor region can also not absorb the laser energy.

On the contrary, in accordance with the present invention, the semiconductor region is heated in advance so that the difference in temperature between the source and drain regions and the channel region is substantially lessened. Because of this, the undesirable stress caused therebetween is significantly reduced resulting in a high reliability.

BRIEF DESCRIPTION OF THE DRAWINGS

The accompanying drawings, which are incorporated in and form a part of the invention and, together with the description, serve to explain the principles of the invention.

FIG. 6 is a schematic perspective view showing a linear laser annealing apparatus suitable for performing the laser annealing in accordance with the present invention.

DETAILED DESCRIPTION OF THE PREFERRED EMBODIMENTS

The inventors have conducted experiments to estimate and confirm the effects and advantages of a method of forming a semiconductor device in accordance with the present invention as explained below in details. A silicon oxide film was deposited on each of sample substrate made of Corning 7059 glass by sputtering or plasma CVD to a thickness of 2000 angstroms in an atmosphere of argon and oxygen. An amorphous silicon semiconductor film is deposited on the silicon oxide film by plasma CVD or low pressure CVD technique to a thickness of 100 to 2000 angstroms, e.g. 1500 angstroms, and patterned to form an island on the substrate. The amorphous silicon semiconductor film is made of a substantially intrinsic semiconductor material.

The upper surface of this structure is coated with a silicon oxide film deposited by a plasma CVD technique to a thickness of 1000 angstroms. An impurity element was introduced into the semiconductor film by plasma doping. The impurity element was phosphorous introduced with phosphine ($PH_3$) at an acceleration voltage of 80KeV or boron introduced with diboran ($B_2H_6$) at an acceleration voltage of 60KeV. The dose density of the plasma doping was $4\times10^{15}$ cm$^{-2}$ respectively for each sample.

The respective sample substrate were heated to several temperature between room temperature to 450° C. respectively. The impurity atoms introduced into semiconductor films of the respective samples were activated by exposure to laser light. The laser light was preferably generated by a KrF excimer laser. The conditions of this laser annealing were as follows.

Laser Energy Density: 200 to 350 mJ/cm$^2$

Shot Repetition: 2 times

Wavelength: 248 nm

Pulse Width: 30 nsec

Atmosphere: Pure nitrogen

Figure 1A:
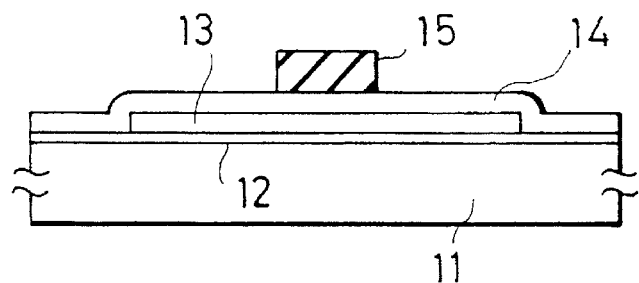
FIGS. 1 (A) to 1 (E) are cross sectional views showing a method of forming an n-type insulated gate thin film field effect transistor in accordance with a first embodiment of the present invention FIGS. 2 (A) to 2 (E) are cross sectional views showing a method of forming an n-type insulated gate thin film field effect transistor in accordance with a second embodiment of the present invention FIG. 3 (A) is a graphical diagram showing the relationship between the sheet resistance of semiconductor films and the substrate temperature in the case that the semiconductor films were doped with phosphorous.
Figure 1B:
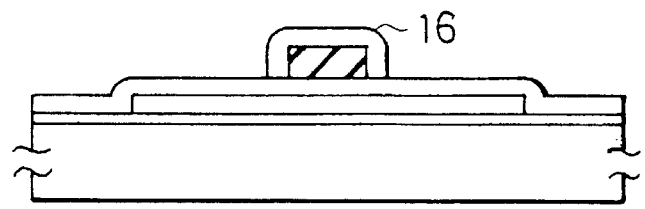
Figure 1C:
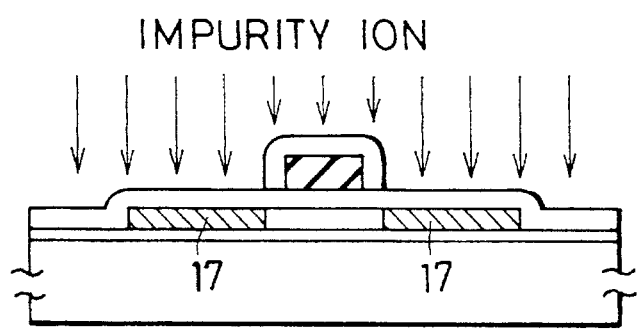
Figure 1D:
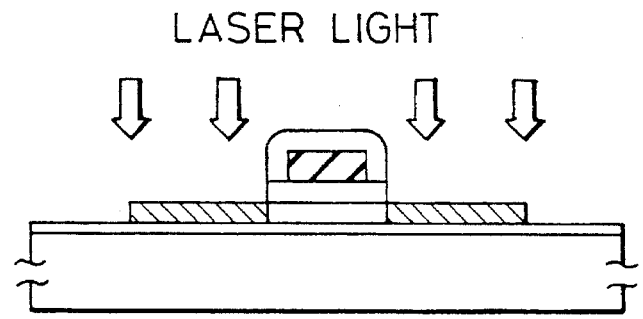
Figure 1E:
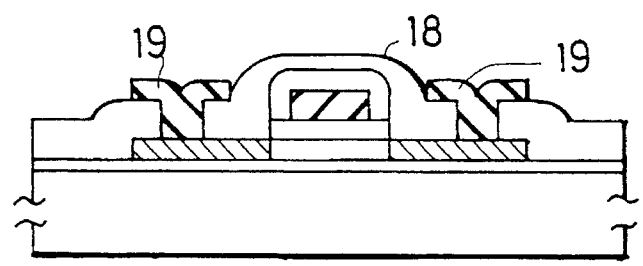
Figure 2A:
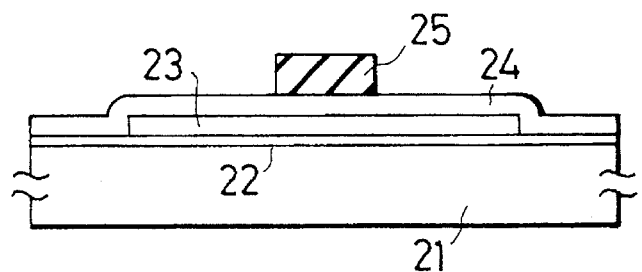
Figure 2B:
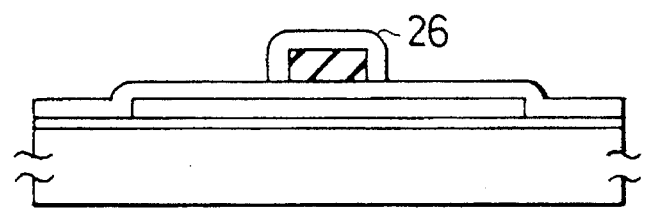
Figure 2C:
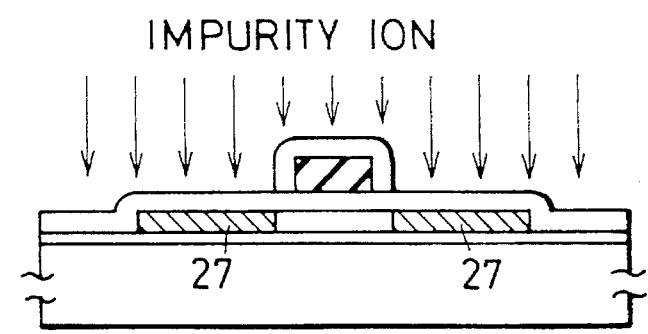
Figure 2D:
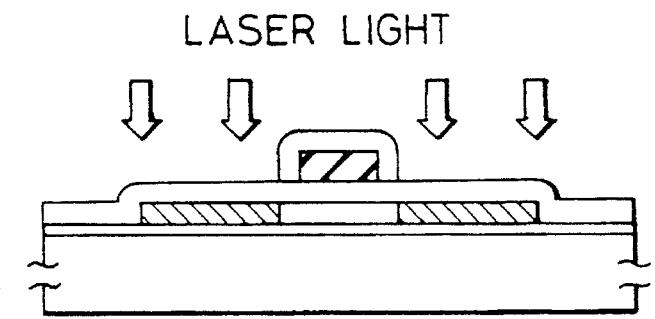
Figure 2E:
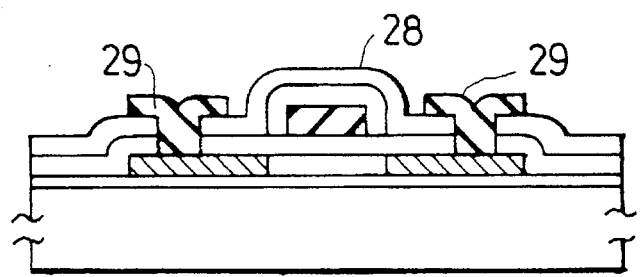
Figure 3A:
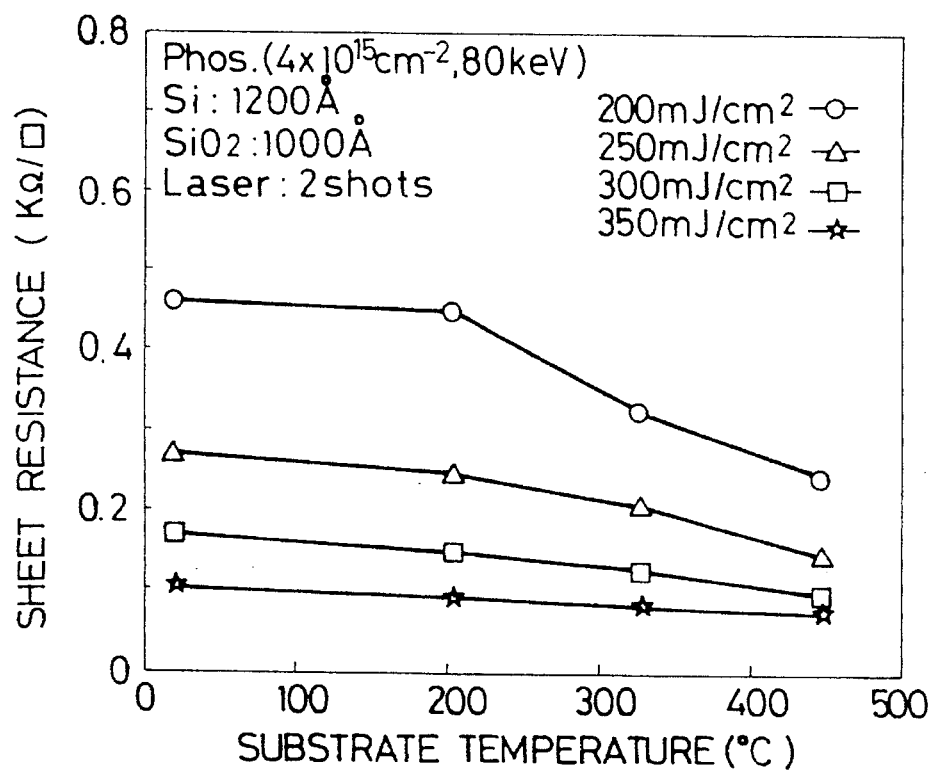
FIG. 3 (B) is a graphical diagram showing the relationship between the sheet resistance and the substrate temperature in the case that the semiconductor films were doped with boron.
Figure 3B:
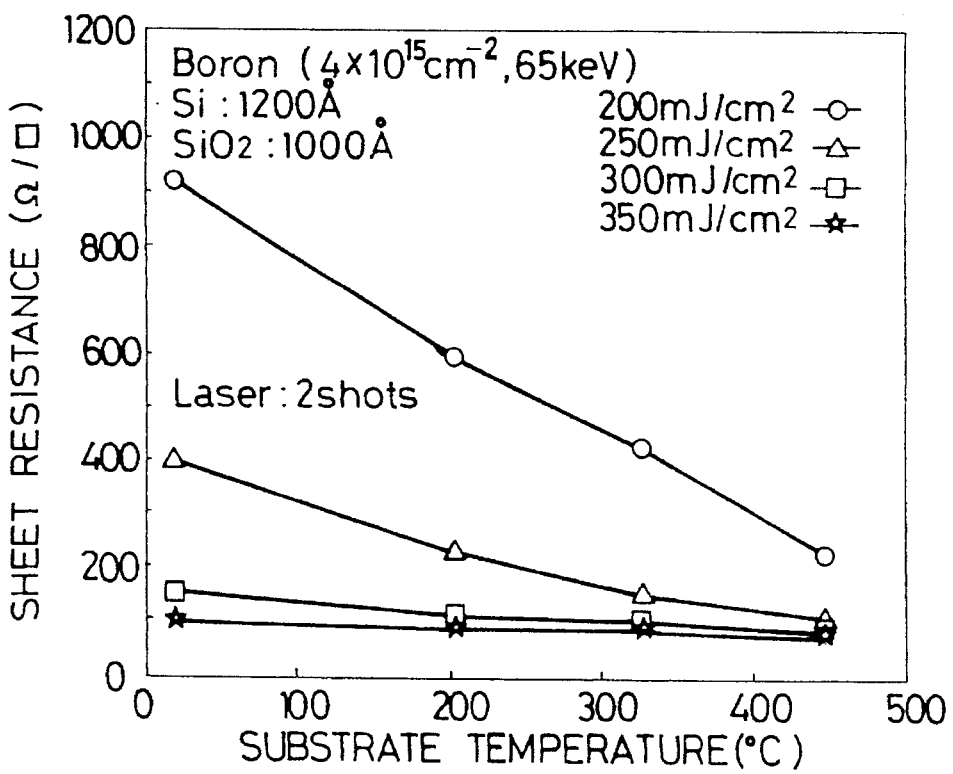

The sheet resistances of the semiconductor films of the respective samples were measured. As a result, graphical diagrams shown in FIGS. 3 (A) and 3 (B) were obtained. FIG. 3 (A) is a graphical diagram showing the relationship between the sheet resistance and the substrate temperature in the case that the semiconductor films were doped with phosphorous. FIG. 3 (B) is a graphical diagram showing the relationship between the sheet resistance and the substrate temperature in the case that the semiconductor films were doped with boron. In the case that it is desired to obtain 300 ohms per square or lower sheet resistances by activation of the phosphorous-doped the semiconductor films, laser energy density of 200mJ/cm$^2$ is sufficient for this purpose when the substrate is heated to 450° C. during activation process whereas 250mJ/cm$^2$ or higher laser energy densities may be needed for the same purpose if the substrate is not heated. Accordingly, the required energy can be reduced by 20% by employing preheating the substrate. In the case that it is desired to obtain 400 ohms per square or lower sheet resistances by activation of the boron-doped the semiconductor films, laser energy density of 200mJ/cm$^2$ can be is employed for this purpose when the substrate heated to 300° to 350° C. during activation process whereas 250mJ/cm$^2$ or higher laser energy densities may be needed for the same purpose if the substrate is not heated.

Figure 4A:
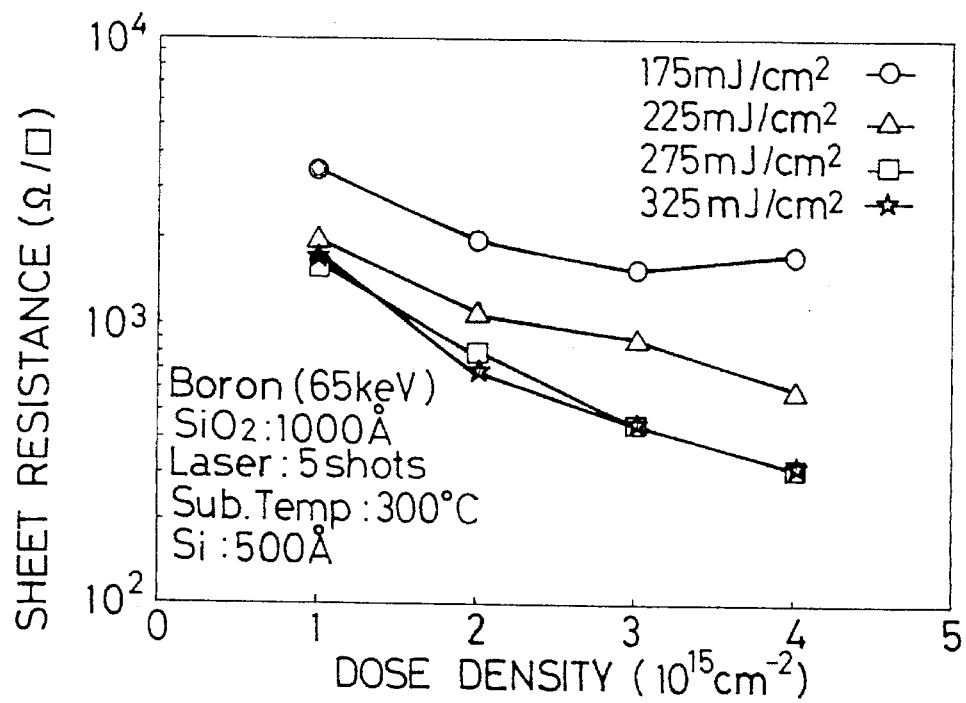
FIG. 4 (A) is a graphical diagram showing the relationship between the dose density of the impurity and the sheet resistance of semiconductor films in accordance with the present invention in the case that the semiconductor films were doped with phosphorous and that the thickness of the silicon semiconductor films was 500 angstroms.
FIG. 4(B) is a graphical diagram showing the relationship between the dose density of the impurity and the sheet resistance of semiconductor films in accordance with the present invention in the case that the semiconductor films were doped with boron and that the thickness of the silicon semiconductor films was 500 angstroms.
Figure 4B:
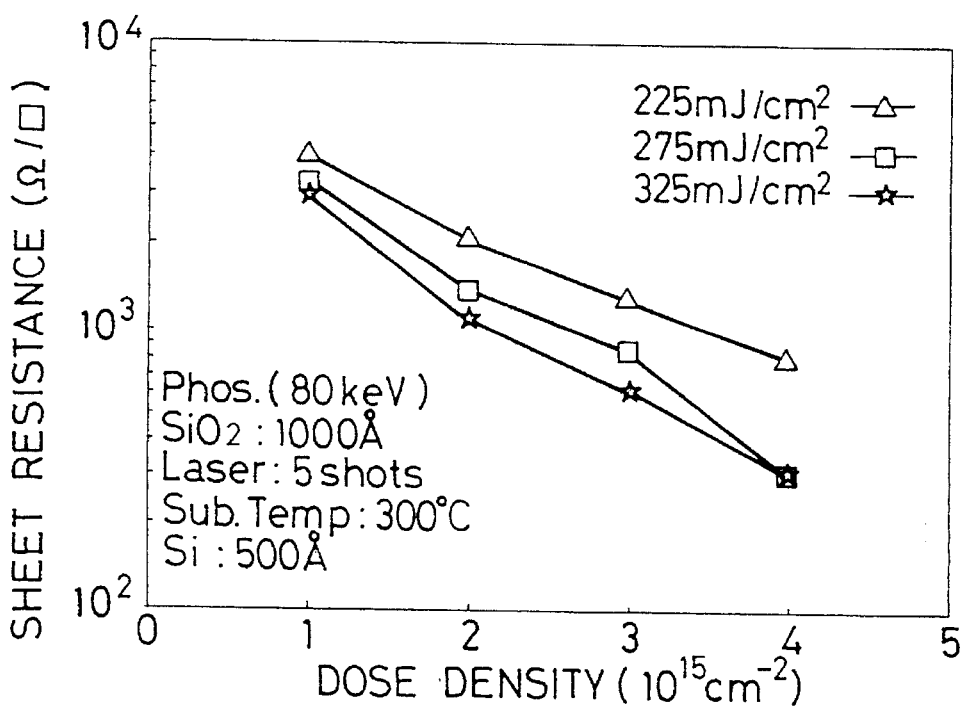
Figure 5A:
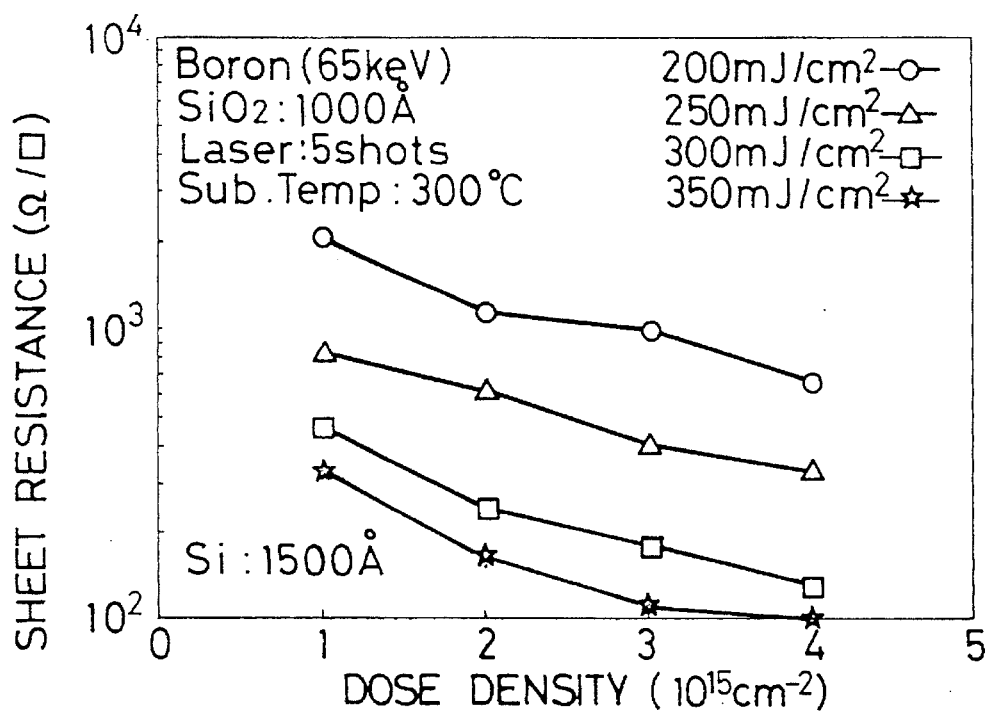
FIG. 5(A) is a graphical diagram showing the relationship between the dose density of the impurity and the sheet resistance of semiconductor films in accordance with the present invention in the case that the semiconductor films were doped with phosphorous and that the thickness of the silicon semiconductor films was 1500 angstroms.
Figure 5B:
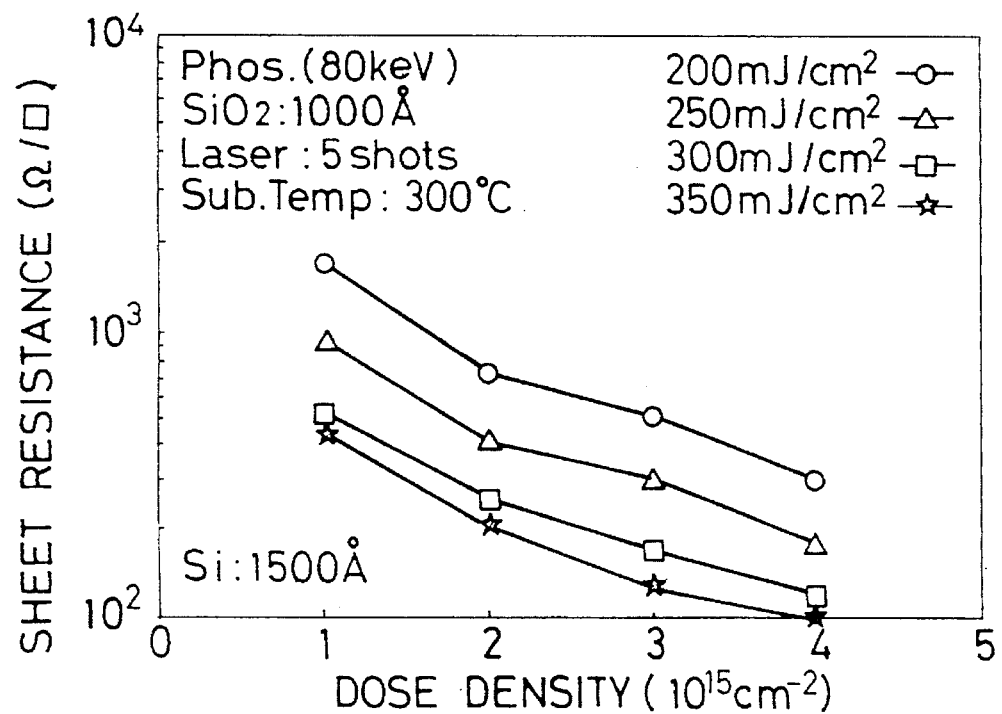
FIG. 5 (B) is a graphical diagram showing the relationship between the dose density of the impurity and the sheet resistance of semiconductor films in accordance with the present invention in the case that the semiconductor films were doped with boron and that the thickness of the silicon semiconductor films was 1500 angstroms.

Similar experiments were also conducted in order to investigate the relationship between the dose density of the impurity and the sheet resistance. In this case, the dose density was selected to be several values from $1\times10^{15}$ cm$^{-2}$ to $4\times10^{15}$ cm$^{-2}$ while the substrate temperature was kept at 300° C. FIGS. 4 (A) and 4 (B) and FIGS. 4 (A) and 4 (B) are graphical diagrams showing the results of the experiments. FIGS. 4 (A) and 4 (B) were plotted in the case that the thickness of the silicon semiconductor films was 500 angstroms and FIGS. 5 (A) and 5 (B) were plotted in the case that the thickness of the silicon semiconductor films was 1500 angstroms. It was confirmed from these experiments that a lower sheet resistance can be obtained with a higher dose density and that a thicker semiconductor film has a lower sheet resistance than a thinner semiconductor film has when other formation conditions are equal. When applied for forming thin film field effect transistor, it is desirable to reduce the sheet resistance to 500 ohms per square or lower. This end can be achieved even with a dose density of $1\times10^{15}$cm$^{-2}$. If the thickness of the silicon semiconductor film, the substrate temperature and the laser energy density are 1500 angstroms, 300° C. and 300mJ/cm$^2$ respectively.

Referring now to FIGS. 1(A) to 1(E), a method of forming an n-type insulated gate thin film field effect transistor in accordance with a first embodiment of the present invention will be explained.

A silicon oxide film 12 is deposited on a Corning 7059 glass substrate by a plasma CVD technique to a thickness of 500 to 2500 angstroms in an atmosphere of tetraethoxysilane and oxygen. An amorphous silicon semiconductor film is deposited on the silicon oxide film 12 by a plasma CVD technique in the same manner to a thickness of 100 to 2000 angstroms e.g. 1500 angstroms to be source, channel and drain regions. The amorphous silicon semiconductor film is made of a substantially intrinsic semiconductor material. The silicon oxide 12 and the amorphous silicon semiconductor film are sequentially formed by means of a multichamber system comprising at least two vacuum chambers whose inside spaces are isolated from air.

The glass substrate 11 coated with the silicon oxide film 12 and the amorphous silicon semiconductor film is then dehydrogenized at 430° C. for 30 to 60 minutes followed by thermal annealing at 600° C. for 24 to 48 hours in order to crystallize the amorphous silicon semiconductor film. It is effective to carry out this crystallization by irradiating a laser light to the amorphous silicon film while heating the amorphous silicon film. For example, the amorphous silicon film is thermally annealed by irradiating a laser light having a wavelength of 308nm using the apparatus of FIG. 6 while heating the substrate to 300° C. The atmosphere may be a vacuum for heat insulation. Nitrogen atmosphere under atmospheric pressure is also favorable. The irradiation of the laser light may be carried out after forming the silicon island region. It is effective to promote crystallization as follows. The amorphous silicon film is first crystallized by heating, and next patterned into an island, and thereafter the silicon island is irradiated with a laser light for the promotion of the crystallization. The amorphous silicon semiconductor film is then patterned to form a semiconductor region 13 the form of an island. The upper surface of this structure is coated with a silicon oxide film 14 deposited by a plasma CVD technique to a thickness of 1000 angstroms. An aluminum film is also deposited by vacuum evaporation to a thickness of 5000 angstroms and patterned to form a gate electrode 15 as shown in FIG. 1 (A).

The substrate is placed in a 3% ethylene glycol solution of dihydroxysuccinic acid for anoding. A current is passed through the solution with the gate electrode 15 as an anode and a platinum as a cathod which is also placed the solution to initiate anodic oxidation. The current is kept constant during the anodic oxidation while the voltage between the anode and the cathod is gradually increased to 220 V. As a result, an anodic oxidation film 16 is formed around the gate electrode 15 as illustrated in FIG. 1 (B). The anodic oxidation film 16 and the gate electrode 15 are collectively called simply as the gate electrode 15 hereinbelow.

Next, an impurity element introduced into the semiconductor region 13 by plasma doping with the gate electrode 15 as a mask. The impurity element for example, phosphorous to form source and drain regions 17 as illustrated in FIG. 1 (C). The conditions of the plasma doping are as follows.

Dose Density: $1\times10^{14}$ to $5\times10^{15}$ cm$^{-2}$, e.g. $1\times10^{15}$ cm$^{-2}$
   Acceleration Voltage: 30 to 120 KV, e.g. 80 kV
   RF plasma power: 5 to 50 W, e.g. 10 to 20 W The silicon oxide film 14 is removed by etching with hydrogen fluoride except for the portion located just below the gate electrode 15 to expose the source and drain regions 17. The substrate is heated by means of a heater to a temperature no lower than 100° C. e. g., 300° C. for example. The substrate temperature is preferably selected to be no higher than 450° C. in order to avoid possible damage on the source and drain regions 17. The source and drain regions 17 is then exposed to laser rays from the upper side as illustrated in FIG. 1 (D). The laser rays are preferably generated by a KrF excimer laser. The conditions of this laser annealing are as follows.

Laser Energy Density: 200 mJ/cm$^2$
   Shot repetition: 5 times
   Substrate temperature: 300° C.
   Atmosphere: 100% nitrogen under atmospheric pressure Since the source and drain regions 17 are exposed to the laser light, the impurity atoms contained therein sufficiently activated in spite of the low laser energy such as 200 mJ/cm$^2$. As a result, relatively high sheet resistances of the source and drain regions 17 can be realized typically as high as 300 to 500 ohms per square even though the dose density is only a fourth of a conventionally employed density.

Next, A silicon oxide film 18 is deposited over the gate electrode 15 by a plasma CVD technique to a thickness of 2000 to 30000 angstroms e.g. 6000 angstroms. After opening contact holes, an aluminum film is deposited to contact with the source and drain regions 17 respectively through the contact holes and patterned to provide source and drain electrodes 19 as illustrated in FIG. 1 (E).

In accordance with experiments conducted by the inventors, the thin film transistors formed typically had carrier mobilities as high as 50 to 90 cm$^2$/Vs. Similar thin film transistors were formed in accordance with a conventional method for the purpose of estimating the improvement of reliability of the thin film transistor according to this embodiment of the present invention as compared to the conventional technique. The formation condition in accordance with the conventional technique were selected to equal to those of the above-explained embodiment except for the followings.

Dose Density: $4\times10^{15}$ cm$^{-2}$
   Laser Energy Density: 250 mJ/cm$^2$

With the respective sources being grounded, 25 V was applied for an hour between the respective drain and gate terminals of each of the thin film transistors according to the present invention and the conventional technique. As a result, the fluctuation of the threshold voltage and the reduction of the ON current after the voltage application was continued for an hour were limited to less than 0.1 V and less than 10% in the case of the transistor accordance with the present invention whereas the corresponding fluctuation and the reduction in the case of the conventional technique were measured to exceed 1.6 V and 60% respectively. The improvement of reliability was then confirmed by the experiments.

Figure 7A:
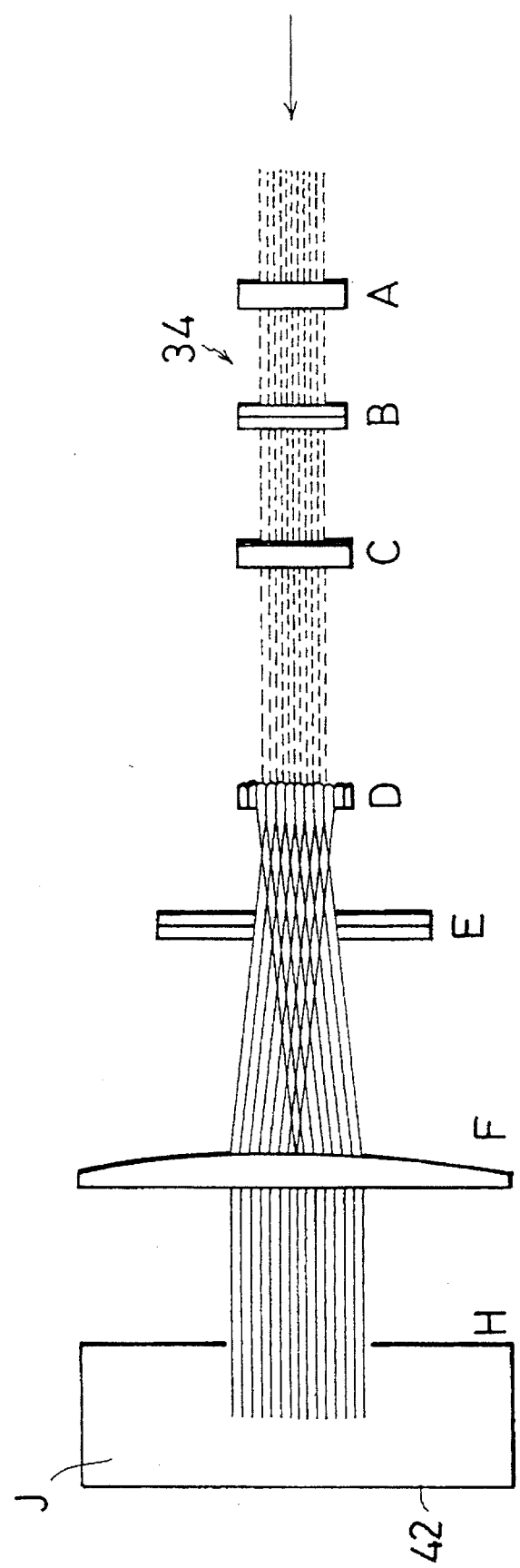
FIGS. 7 (A), 7 (B) and 7 (C) are a plan view, a side view and a perspective view showing the details of the optical system 34 provided in the linear laser annealing apparatus in accordance with the present invention illustrated FIG. 6.

Referring now to FIGS. 6 and 7 (A) to 7 (G), a linear laser annealing apparatus suitable for performing the laser annealing in accordance with the present invention as explained above will be described. A linear laser beam is scanned on the semiconductor layer in a direction perpendicular to the linear beam. A continuous scanning and a step scanning are effective. The continuous scanning (sweeping) is effective for the case that the number of laser shots is large. The step scanning is effective for the case that the width of the laser beam is large since the mass-productivity is improved. FIG. 6 is a schematic perspective view showing the linear laser annealing apparatus. The apparatus comprises a pair of lasing resonators 32 and 33 mounted on a table 31, total reflection mirrors 25 to 39, an optical system 34 for squeezing in one direction and expanding in another direction the laser light entering therein in order to make the laser light flat and a stage 40 on which is movably supported a substrate 41 on which a semiconductor film is deposited and doped with an impurity. When laser annealing is initiated, laser light emitted from the resonator 32, reflected upon the total reflection mirrors 35 and 36 and then passed through the other resonator 38 in which the laser light is further amplified to a necessary energy level. The laser light amplified in the other resonator 38 is then reflected upon the total reflection mirrors 37 and 38 and passed through the optical system 34 in which the cross section of the laser light is reshaped from 3 cm width and 2 cm height to 10 to 30 cm width and 0.1 to 1 cm height. The flat laser light is reflected by the total reflection mirror 39 and projected onto the substrate 41 through a cylindrical focussing lense 42. The width of the laser light is designed to be larger than that of the substrate to be treated so that the whole area of the semiconductor region can be annealed by the laser light by moving the substrate only in one direction perpendicular to the propagation direction of the laser light during the laser emission. That is, the substrate 41 is scanned in the direction K as indicated in FIG. 6. The supporting structure including the stage 40 can therefore be designed in a simple structure. An appropriate heater is provided in the stage in order to heat the substrate to a predetermined temperature. The final energy carried out by the laser light is 1000 mJ per shot at maximum. The shot rate is 50 to 500 shots/min.

FIGS. 7 (A), 7 (B) and 7(C) are a plan view, a side view and a perspective view showing the optical axis of the optical system 34 of FIG. 6. The optical system 34 comprises a cylindrical concave lense A, a cylindrical convex lense B, a holizontal flyeye lense C, vertical flyeye lense D, a cylindrical convex lense E and a cylindrical convex lense F. The holizontal flyeye lense C and the vertical flyeye lense D are provided for the purpose of converting Gauss distribution of laser energy to a rectangular distribution. In the figures, there are illustrated characteristic dimmensions $X_1$ to $X_6$. While the dimmensions $X_1$ and $X_2$ are fixed, the dimmensions $X_3$ between the virtual focus I and the mirror 39 and the dimmensions $X_4$ and $X_5$ are adjusted in order to obtain appropriate the magnification M and the focal distance F. The total travel length $X_6$ of the laser light is about 1.3 m for example. There are following relationships thereamong.

$$M=(X_3+X_4)/X_5$$

$$1/F=1/(X_3+X_4)+1/X_5$$

The original laser light is shaped into a very long linear laser light to improve processability. That is, the linear beam is emitted from the optical system 34, and thereafter irradiated to the sample 41 through the total reflection mirror 39. Because the length of the linear beam is longer than the width of the sample, the entire surface of the sample can be irradiated with a laser light by moving the sample only in one direction perpendicular to the linear beam. Accordingly, one axis structure can be used for the stage for the sample and the driving device 40 to make easy the maintenance and the alignment of the sample with the stage.

Referring now to FIGS. 2 (A) to 2 (E), a method of forming an n-type insulated gate thin film field effect transistor in accordance with a second embodiment of the present invention will be explained.

A silicon oxide film 22 is deposited on a Corning 7059 glass substrate by a sputtering to a thickness of 500 to 2500 angstroms in an atmosphere of argon and oxygen. The proportion of oxygen in the atmosphere is no lower than 50%. Sputtering is sequentially carried out with a target of nickel for 1 to 5 minutes under a weak nitrogen plasma (20 W) after the deposition of silicon oxide. As a result, nickel is formed on the surface of the silicon oxide film 22 in the form of a layer of 10 to 100 atoms in average. This nickel is very effective to promote the crystallization. An amorphous silicon semiconductor film is deposited on the silicon oxide film 22 by a plasma CVD technique in the same manner to a thickness of 1500 angstroms to be source, channel and drain regions. The amorphous silicon semiconductor film is made of a substantially intrinsic semiconductor material. The sputtering of silicon oxide and the nickel and the formation of the amorphous silicon semiconductor film are sequentially performed by means of a multi-chamber system comprising at least three vacuum chambers whose inside spaces are isolated from air.

The glass substrate 21 coated with the silicon oxide film 22 and the amorphous silicon semiconductor film is then dehydrogenized at 430° C. for 30 to 60 minutes followed by thermal annealing at 550° C. for 2 to 4 hours in order to crystallize the amorphous silicon semiconductor film. This thermal annealing can carry out a step for forming a crystal nucleus. Alternatively, this thermal annealing can grow a crystal by lengthening the annealing time. The amorphous silicon semiconductor film is then patterned to form a semiconductor region 23 in the form of an island. Thereafter, the surface of the semiconductor region 23 is irradiated with a linear laser light to grow a crystal. The upper surface of this structure is coated with silicon oxide film 24 deposited by a plasma CVD technique to thickness of 1000 angstroms. An aluminum film is also deposited by vacuum evaporation to a thickness of 5000 angstroms and patterned to form a gate electrode as shown in FIG. 2 (A). The substrate is placed a 3% ethylene glycol solution of dihydroxysuccinic acid for anoding. A current is passed through the solution with the gate electrode 25 as an anode and a platinum as a cathod which is also placed in the solution to initiate anodic oxidation. The current is kept constant during the anodic oxidation while the voltage between the anode and the cathod is gradually increased to 220 V. As a result, an anodic oxidation film 26 is formed around the gate electrode 25 as illustrated in FIG. 2 (B). The anodic oxidation film 26 and the gate electrode 15 are collectively called simply as the gate electrode 25 hereinbelow. Next, an impurity element is introduced into the semiconductor region 23 by plasma doping with the gate electrode 25 as a mask. The impurity element is, for example, phosphorous to form source and drain regions 27 as illustrated in FIG. 2 (C). The conditions of the plasma doping are as follows.

Dose Density: $1\times10^{14}$ to $5\times10^{15}$ cm$^{-2}$, e.g. $2\times10^{15}$ cm$^{-2}$ Acceleration Voltage: 20 to 120 KV, e,g. 80kV RF plasma power: 5 to 50 W, e.g. 10 to 20 W The substrate is heated by means of a heater to 300° C. for example. The substrate temperature is preferably selected to be no higher than 450° C. in order to avoid possible damage on the source and drain regions 27. The source and drain regions 27 is then exposed to laser rays from the upper side as illustrated in FIG. 2 (D). The laser rays are preferably generated by a KrF excimer laser. The conditions of this laser annealing are as follows.

Laser Energy Density: 200 to 400 mJ/cm$^2$, e.g. 250 mJ/cm$^2$

Sweeping repetition: 5 times

Substrate temperature: 300° C.

Atmosphere: Vacuum (degree of vacuum is $10^{-2}$ tort or lower)

As a result, relatively high sheet resistances of the source and drain regions 17 can be realized typically as high as 300 to 500 ohms per square even though the dose density is only a half of conventionally employed density.

Next, A silicon oxide film 28 is deposited over the gate electrode 25 by a plasma CVD technique to a thickness of 2000 to 30000 angstroms, e.g. 6000 angstroms. After opening contact holes, an aluminum film is deposited to contact with the source and drain regions 27 respectively through the contact holes and patterned to provide source and drain electrodes 29 as illustrated in FIG. 2 (E).

In accordance with experiments conducted by the inventors, the thin film transistors formed typically had carrier mobilities as high as 70 to 140 cm2/Vs. Similar thin film transistors were formed in accordance with a conventional method and compared to the thin film transistor according to this embodiment of the present invention for the purpose of estimating the improvement of reliability in tile same manner as in the case of the first embodiment explained above. As a result, the improvement of reliability was confirmed by the experiments in the same manner.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A method of forming a semiconductor device comprising the steps of:

forming a silicon film containing an impurity over a glass substrate;

heating said silicon film: and exposing said heated silicon film to a pulsed laser light to activate atoms of the impurity, wherein a cross section of said pulsed laser light taken perpendicular to a length of said laser light has a width and a height, with said width greater than said height.

2. The method of claim 1 wherein said impurity is at least one of phosphorus and boron.

3. The method of claim 1 wherein said pulsed laser light has an energy density of 200 to 400 mJ/cm$^2$.

4. The method of claim 1 wherein said pulsed laser light is an excimer laser light.

5. The method of claim 1 wherein said substrate has a temperature during said exposing of 100° C. to 500° C.

6. A method of forming a semiconductor device comprising the steps of:

forming a gate insulating film on a crystalline silicon film shaped in the form of an island over a substrate;

forming a gate electrode on said gate insulating film;
introducing phosphorus or boron into said crystalline silicon film with said gate electrode as a mask;
heating said substrate; and
irradiating said crystalline silicon film with a pulsed laser light,
wherein a cross section of said pulsed laser light taken perpendicular to a length of said laser light has a width and a height, with said width greater than said height.

7. The method of claim 6 wherein the wavelength of said pulsed laser light is 400 nm or shorter.

8. The method of claim 6 wherein said substrate is made of a borosilicate glass.

9. The method of claim 6 wherein the energy density of said pulsed laser light is 200 to 400 mJ/cm$^2$.

10. The method of claim 6 wherein said temperature is 100 to 500° C.

11. The method of claim 6 wherein said pulsed laser light is an excimer laser light.

12. The method of claim 6 wherein said substrate has a temperature during said irradiating of 100° C. to 500° C.

13. A method of forming a semiconductor device comprising:
forming a silicon film containing an impurity on a glass substrate;
heating said silicon film; and
scanning said heated silicon film with a laser beam to activate atoms of the impurity,
wherein a cross section of said laser beam taken perpendicular to a length of said laser beam has a width and a height, with said width greater than said height.

14. The method of claim 13 wherein said silicon film has a temperature of 100° C. to 500° C. during said scanning step.

15. The method of claim 13 wherein said laser light has an energy density of 200 to 400 mJ/cm$^2$.

16. The method of claim 13 wherein said laser light is an excimer laser light.

17. A method of forming a semiconductor comprising:
forming a silicon film containing an impurity over a glass substrate; and
scanning said silicon film with a laser beam in a vacuum to activate atoms of the impurity,
wherein a cross section of said laser beam taken perpendicular to a length of said laser beam has a width and a height, with said width greater than said height.

18. The method of claim 17 wherein said silicon film has a temperature of 100° C. to 500° C. during said scanning step.

19. The method of claim 17 wherein said laser beam has an energy density of 200 to 400 mJ/cm$^2$.

20. A method of forming a semiconductor device comprising the steps of:
heating a silicon film containing an impurity; and
exposing the heated silicon film to a pulsed laser light having an energy density of 200 to 400 mJ/cm$^2$, to activate atoms of the impurity;
wherein a cross section of said laser light taken perpendicular to a length of said laser light has a width and a height, with said width greater than said height.

21. A method of forming a semiconductor device comprising the steps of:
forming a silicon film on a substrate;
forming a gate insulating film on the silicon film;

forming a gate electrode on the gate insulating film;
introducing an impurity into the silicon film using the gate electrode as a mask;
heating the silicon film; and
irradiating the heated silicon film with a pulsed laser light having an energy density of 200 to 400 mJ/cm$^2$,
wherein a cross section of said laser light taken perpendicular to a length of said laser light has a width and a height, with said width greater than said height.

22. A method of forming a semiconductor device comprising the steps of:
forming an intrinsic semiconductor layer comprising silicon over a substrate;
heating said semiconductor layer; and
crystallizing said semiconductor layer by irradiating a laser beam to said heated semiconductor layer,
wherein a cross section of said laser beam taken perpendicular to a length of said laser beam has a width and a height, with said width greater than said height.

23. The method of claim 22 wherein said laser beam is emitted from an upper portion of said semiconductor layer.

24. The method of claim 22 wherein said substrate is placed in a vacuum during said irradiation step.

25. A method of forming a semiconductor device comprising the steps of:
forming a semiconductor layer over a substrate;
heating said semiconductor layer;
emitting a pulsed laser beam wherein a cross section of said laser beam taken perpendicular to a length of said laser beam has a width and a height, with said width greater than said height; and
scanning said heated semiconductor layer with said pulsed laser beam in a direction orthogonal to said width of said laser beam.

26. The method of claim 25 wherein said scanning is carried out in a step-wise manner.

27. The method of claim 25 wherein said scanning is carried out in a continuous manner.

28. The method of claim 25 wherein said semiconductor layer has an intrinsic conductivity.

29. The method of claim 25 wherein said semiconductor layer is doped with an impurity for imparting one conductivity type thereto.

30. A method of forming a semiconductor device comprising the steps of:
forming a semiconductor layer over a substrate;
emitting a pulsed laser beam wherein a cross section of said laser beam taken perpendicular to a length of said laser beam has a width and a height, with said width greater than said height; and
scanning said semiconductor layer with said pulsed laser beam,
wherein said substrate is scanned with said laser beam by moving said substrate in a direction orthogonal to said width of said laser beam.

31. The method of claim 30 wherein said scanning is carried out in a step-wise manner.

32. The method of claim 30 wherein said scanning is carried out in a continuous manner.

33. The method of claim 30 wherein said semiconductor layer has an intrinsic conductivity.

34. The method of claim 30 wherein said semiconductor layer is doped with an impurity for imparting one conductivity type thereto.

35. The method of claim 1 wherein said substrate is moved in a direction orthogonal to said width of said laser light so that an entire surface of said silicon film is scanned with said laser light.

36. The method of claim 6 wherein said substrate is moved in a direction orthogonal to said width of said laser light so that an entire surface of said silicon film is scanned with said laser light.

37. The method of claim 13 wherein said scanning is carded out by moving said substrate.

38. The method of claim 17 wherein said scanning is carded out by moving said substrate.

39. The method of claim 22 wherein said pulsed laser beam is an excimer laser beam.

40. The method of claim 25 wherein said pulsed laser beam is an excimer laser beam.

41. The method of claim 28 wherein said pulsed laser beam is an excimer laser beam.

* * * * *